ＵＳ００９４３８２３１Ｂ２

(12) United States Patent
Nagai

(10) Patent No.: US 9,438,231 B2
(45) Date of Patent: Sep. 6, 2016

(54) GATE DRIVE CIRCUIT

(71) Applicant: Panasonic Intellectual Property Management Co., Ltd., Osaka (JP)

(72) Inventor: Shuichi Nagai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/690,429

(22) Filed: Apr. 19, 2015

(65) Prior Publication Data

US 2015/0222264 A1 Aug. 6, 2015

Related U.S. Application Data

(63) Continuation of application No. PCT/JP2014/003486, filed on Jul. 1, 2014.

(30) Foreign Application Priority Data

Aug. 23, 2013 (JP) ................. 2013-173874

(51) Int. Cl.
| | | |
|---|---|---|
| *H03K 17/06* | (2006.01) | |
| *H03K 17/691* | (2006.01) | |
| *H02M 1/08* | (2006.01) | |
| *H03K 17/18* | (2006.01) | |
| *H03K 17/16* | (2006.01) | |
| *H03K 17/687* | (2006.01) | |
| *H03K 17/693* | (2006.01) | |

(52) U.S. Cl.
CPC ............ *H03K 17/691* (2013.01); *H02M 1/08* (2013.01); *H03K 17/16* (2013.01); *H03K 17/18* (2013.01); *H03K 17/6877* (2013.01); *H03K 17/693* (2013.01); *H03K 2217/009* (2013.01)

(58) Field of Classification Search
USPC ................. 327/109, 374, 376–379, 383–384
See application file for complete search history.

(56) References Cited

U.S. PATENT DOCUMENTS

| 8,866,516 B2 | 10/2014 | Nagai et al. |
| 2008/0165027 A1 | 7/2008 | Ammann |
| 2013/0270925 A1 | 10/2013 | Tanaka et al. |

FOREIGN PATENT DOCUMENTS

| JP | 2003-299344 | 10/2003 |
| JP | 2006-280100 | 10/2006 |

(Continued)

OTHER PUBLICATIONS

International Search Report of PCT application No. PCT/JP2014/003486 dated Sep. 9, 2014.

*Primary Examiner* — An Luu
(74) *Attorney, Agent, or Firm* — McDermott Will & Emery LLP

(57) ABSTRACT

A gate drive circuit in an aspect of the present disclosure includes: a first electromagnetic resonant coupler that isolatedly transmits a transmission signal from the primary side to the secondary side, and also isolatedly transmits a reflected signal from the secondary side to the primary side; a modulator circuit that modulates a radio-frequency wave with an input signal to generate the transmission signal; a demodulator circuit that demodulates the transmission signal to generate an output signal; a variable capacitance diode into which the transmission signal is input from the first electromagnetic resonant coupler, the variable capacitance diode disposed on the secondary side, the variable capacitance diode allowing a capacitance thereof to vary according to a monitor signal; and a reflected signal rectifier circuit that rectifies the reflected signal input to generate a monitor output signal.

20 Claims, 10 Drawing Sheets

(56) References Cited

FOREIGN PATENT DOCUMENTS

| | | |
|---|---|---|
| JP | 2008-067012 | 3/2008 |
| JP | 2009-501323 | 1/2009 |
| JP | 2011-244185 | 12/2011 |
| JP | 2012-135109 | 7/2012 |
| JP | 2013-070581 | 4/2013 |
| WO | 2013/065254 | 5/2013 |

GATE DRIVE CIRCUIT

BACKGROUND

1. Technical Field

The present disclosure relates to a gate drive circuit that drives a semiconductor switch.

2. Description of the Related Art

A gate drive circuit for a semiconductor switching element (also referred to simply as a switching element) applies a gate voltage to the gate terminal of the switching element to control its on and off states. This control may be referred to below simply as gate driving. The gate drive circuit controls the on and off states of a high-voltage switching element such as, for example, an insulated gate bipolar transistor (IGBT), which is a type of power device.

In a gate drive circuit for this type of power device, a reference voltage on the output side connected to the switching element is very high. Therefore, a direct-current component needs to be isolated between a primary side, into which a control signal is entered, and a secondary side, from which a gate voltage is output to the switching element. In other words, signal ground needs to be isolated.

An electric circuit element that can isolate the direct-current component between the primary side and secondary side may be referred to as a signal isolator. The signal isolator is essential to the driving of a power device. The signal isolator isolates logic ground and radio-frequency (RF) ground from each other.

To drive a switching element, which is a power device, an isolated power supply unit is required separately. The isolated power supply unit may cause a circuit size to be increased. If the gate drive circuit enables not only a gate signal but also a gate power to be isolatedly supplied to the gate of the switching element, an external isolated power supply unit becomes unnecessary, enabling the gate drive circuit to be made compact.

Japanese Unexamined Patent Application Publication No. 2008-067012 discloses an electric power transmission system, as illustrated in FIG. 1, in which an open-ring resonator is used as a signal isolator.

SUMMARY

An output signal from a gate drive circuit may not be stabilized depending on the load connected to the output side of the gate drive circuit.

One non-limiting and exemplary embodiment provides a gate drive circuit that can monitor a secondary-side state on the primary side.

A gate drive circuit according to one aspect of the present disclosure includes: a first electromagnetic resonant coupler that isolatedly transmits a transmission signal from a primary side of the gate drive circuit to a secondary side of the gate drive circuit, and isolatedly transmits a reflected signal from the secondary side to the primary side, the primary side and the secondary side isolated from each other, the reflected signal generated by reflecting the transmission signal on the secondary side; a modulator circuit that modulates a radio-frequency wave with an input signal to generate the transmission signal and outputs the transmission signal to the first electromagnetic resonant coupler, the modulator circuit disposed on the primary side; a demodulator circuit that demodulates the transmission signal input from the first electromagnetic resonant coupler to generate an output signal and outputs the output signal to a semiconductor switch, the demodulator circuit disposed on the secondary side; a variable capacitance diode into which the transmission signal is input from the first electromagnetic resonant coupler, the variable capacitance diode disposed on the secondary side, the variable capacitance diode allowing a capacitance thereof to vary according to a monitor signal; and a reflected signal rectifier circuit that rectifies the reflected signal input from the first electromagnetic resonant coupler to generate a monitor output signal, the reflected signal rectifier circuit disposed on the primary side.

The gate drive circuit according to the present disclosure can monitor a secondary-side state on a primary side.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
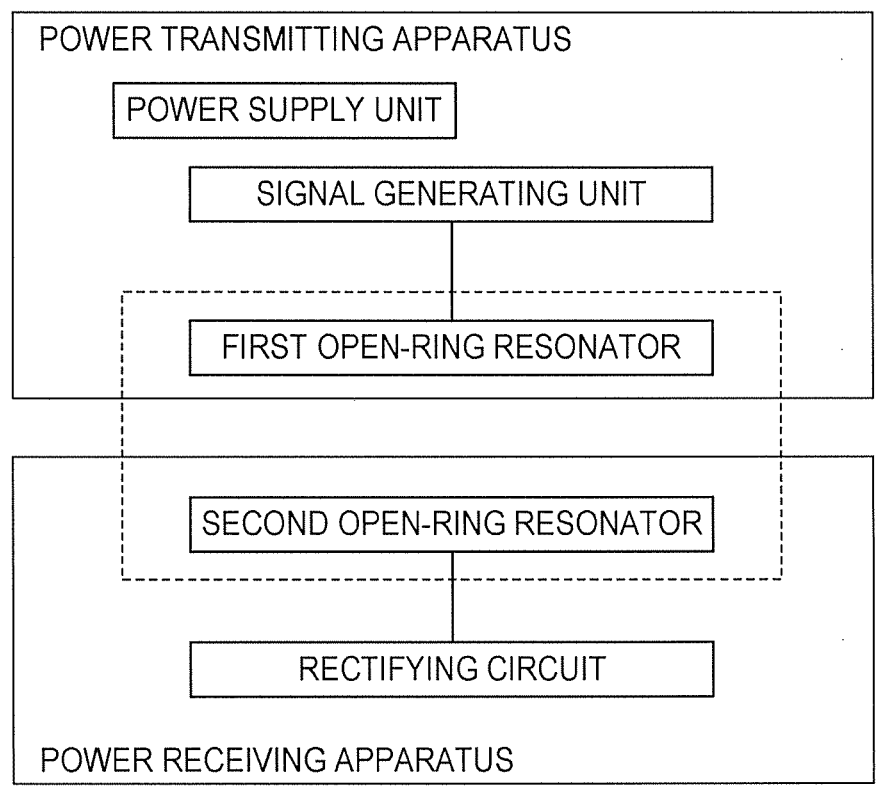
FIG. 1 is a block diagram illustrating the structure of a conventional signal transmission system.

Underlying Knowledge Forming Basis of the Present Disclosure

An output signal from a gate drive circuit having a signal isolator may not be stabilized depending on the load connected to the output side of the gate drive circuit.

With a conventional gate drive circuit that uses transformer-based electromagnetic inductive coupling to provide isolation between the primary side and the secondary side, the switching speed of a semiconductor switching element is restricted. Therefore output variations with the load have not been a large problem.

By contrast, a gate drive circuit that uses, for example, electromagnetic resonant coupling to provide isolation between the primary side and the secondary side, can switch a semiconductor switching element at high speed.

In this high-speed switching, an output signal from the gate drive circuit may not be stabilized depending on the load connected to the output side of the gate drive circuit.

For example, the gate characteristics of a semiconductor switching element may vary depending on whether the semiconductor switching element is turned on or off. Since the characteristics of the gate vary in this way, an output from the gate drive circuit may not be stabilized.

In this situation, a variation of a load connected to the secondary side of the gate drive circuit can be preferably monitored on its primary side. Thus, the gate drive circuit can control a signal output from the primary side to the secondary side according to the variation of the load.

Overview of Embodiments

A gate drive circuit in a first aspect of the present disclosure includes: a first electromagnetic resonant coupler that isolatedly transmits a transmission signal from a primary side of the gate drive circuit to a secondary side of the gate drive circuit, and isolatedly transmits a reflected signal from the secondary side to the primary side, the primary side and the secondary side isolated from each other, the reflected signal generated by reflecting the transmission signal on the secondary side; a modulator circuit that modulates a radio-frequency wave with an input signal to generate the transmission signal and outputs the transmission signal to the first electromagnetic resonant coupler, the modulator circuit disposed on the primary side; a demodulator circuit that demodulates the transmission signal input from the first electromagnetic resonant coupler to generate an output signal and outputs the output signal to a semiconductor switch, the demodulator circuit disposed on the secondary side; a variable capacitance diode into which the transmission signal is input from the first electromagnetic resonant coupler, the variable capacitance diode disposed on the secondary side, the variable capacitance diode allowing a capacitance thereof to vary according to a monitor signal; and a reflected signal rectifier circuit that rectifies the reflected signal input from the first electromagnetic resonant coupler to generate a monitor output signal, the reflected signal rectifier circuit disposed on the primary side.

The reflected signal is generated on the secondary side depending on the monitor signal, transmitted from the secondary side to the primary side, and rectified on the primary side so that the monitor output signal is generated. With the gate drive circuit, therefore, a variation of a load connected to the secondary side of the gate drive circuit can be monitored on the primary side of the gate drive circuit.

For example, in the gate drive circuit in the first aspect of the present disclosure, the demodulation circuit may include a rectifier circuit that rectifies the transmission signal to generate the output signal.

For example, in the gate drive circuit in the first aspect of the present disclosure, the variable capacitance diode may be disposed between first electromagnetic resonant coupler and the rectifier circuit. The reflected signal may be generated by reflecting the transmission signal between first electromagnetic resonant coupler and the rectifier circuit.

When the capacitance of the variable capacitance diode varies according to the monitor signal, an input impedance between the rectifier and the first electromagnetic resonant coupler varies, and thereby a reflection amount of the reflected signal also varies. Therefore, information about the monitor signal can be appropriately incorporated in the reflected signal through the variable capacitance diode.

For example, the gate drive circuit in the first aspect may further include: a transmission line extending between the first electromagnetic resonant coupler and the rectifier circuit; an output terminal through which the output signal is output to a semiconductor switch, the output terminal disposed on the secondary side; an output reference terminal through which an output reference potential is applied to the semiconductor switch, the output reference terminal disposed on the secondary side. One end of the variable capacitance diode may be connected to the transmission line, and the other end of the variable capacitance diode may be connected to the output reference terminal.

For example, the gate drive circuit in the first aspect may further include a signal separator that separates the transmission signal and the reflected signal from each other, the signal separator disposed between the modulator circuit and the first electromagnetic resonant coupler on the primary side. For example, the gate drive circuit in the first aspect may further include a directional coupler that allows the transmission signal to pass from the modulator circuit to the first electromagnetic resonant coupler and also allows the reflected signal to pass from the first electromagnetic resonant coupler to the monitor circuit, the directional coupler disposed between the modulator circuit and the first electromagnetic resonant coupler on the primary side.

Since the gate drive circuit includes the signal separator and/or the directional coupler, the reflected signal can be efficiently input into the reflected signal rectifier circuit.

For example, in the gate drive circuit in the first aspect, the first electromagnetic resonant coupler may include a first terminal into which the transmission signal is input, the first terminal disposed on the primary side; a second terminal from which the transmission signal input from the first terminal is output and into which the reflected signal is input, the second terminal disposed on the secondary side; and a third terminal from which the reflected signal input from the second terminal is output, the third terminal disposed on the primary side, and the reflected signal rectifier circuit rectifies the reflected signal output from the third terminal.

Since different terminals are used as the first terminal, into which the transmission signal is input, and as the third terminal, from which the reflected signal is output, the reflected signal can be efficiently input into the reflected signal rectifier circuit.

A gate drive circuit in a second aspect of the present disclosure, for example, includes: a first electromagnetic resonant coupler that isolatedly transmits a first radio-frequency wave from a primary side of the gate drive circuit to a secondary side of the gate drive circuit, and isolatedly transmits a reflected signal from the secondary side to the primary side, the primary side and the secondary side isolated from each other, the reflected signal generated by reflecting the first radio-frequency wave on the secondary side; a modulator circuit that modulates a second radio-frequency wave with an input signal to generate the transmission signal and outputs the transmission signal to the second electromagnetic resonant coupler, the modulator circuit disposed on the primary side; a second electromagnetic resonant coupler that isolatedly transmits a transmission signal from the primary side to the secondary side; a demodulator circuit that demodulates the transmission signal input from the second electromagnetic resonant coupler to generate an output signal, the demodulator circuit disposed on the secondary side; a variable capacitance diode into which the first radio-frequency wave is input from the first electromagnetic resonant coupler, the variable capacitance diode disposed on the secondary side, the variable capacitance diode allowing a capacitance thereof to vary according to a monitor signal; and a reflected signal rectifier circuit that rectifies the reflected signal input from the first electromagnetic resonant coupler to generate a monitor output signal, the reflected signal rectifier circuit disposed on the primary side.

The reflected signal is generated on the secondary side depending on the monitor signal, transmitted from the secondary side to the primary side, and rectified on the primary side so that the monitor output signal is generated. With the gate drive circuit, therefore, a variation of a load connected to the secondary side of the gate drive circuit can be monitored on the primary side of the gate drive circuit. Since different circuits are used as the second electromagnetic resonant coupler for transmitting the transmission signal and the first electromagnetic resonant coupler for transmitting the reflected signal, the monitor output signal can be obtained independently of the circuits that transmit and output a gate driving signal.

For example, in the gate drive circuit in the second aspect of the present disclosure, the demodulation circuit may include a rectifier circuit that rectifies the transmission signal to generate the output signal.

For example, in the gate drive circuit in the second aspect of the present disclosure may further include a transmission line extending from the first electromagnetic resonant coupler to the secondary side. One end of the variable capacitance diode may be connected to a transmission line, and the reflected signal may be generated by reflecting the first radio-frequency wave on the transmission line.

When the capacitance of the variable capacitance diode varies according to the monitor signal, an input impedance on the transmission line, and thereby a reflection amount of the reflected signal also varies. Therefore, information about the monitor signal can be appropriately incorporated in the reflected signal through the variable capacitance diode.

For example, the gate drive circuit in the second aspect may further include: a transmission line extending from the first electromagnetic resonant coupler to the secondary side; and a reference potential line that applies a reference potential, the reference potential line disposed on the secondary side. One end of the variable capacitance diode may be connected to the transmission line, and the other end of the variable capacitance diode may be connected to the reference potential line.

For example, in the gate drive circuit in the first or second aspect, the variable capacitance diode may cause an amplitude of the reflected signal to vary, when the capacitance of the variable capacitance diode varies. Thus, information about a variation of the load connected to the secondary side of the gate drive circuit can be monitored on the primary side of the gate drive circuit through the magnitude of the amplitude of the reflected signal.

For example, the gate drive circuit in the first or second aspect may further include: an input terminal through which the input signal is input to the modulator circuit, the input terminal disposed on the primary side; an output terminal through which the output signal is output to a semiconductor switch, the output terminal disposed on the secondary side; and a monitor terminal through which the monitor signal is input to the reflected signal rectifier circuit, the monitor terminal disposed on the secondary side.

For example, the gate drive circuit in the first or second aspect may further include a radio-frequency oscillator that generates the radio-frequency wave and outputs the radio-frequency wave to the modulator circuit, the radio-frequency oscillator disposed on the primary side.

For example, in the gate drive circuit in the first or second aspect, the radio-frequency oscillator may allow an oscillation frequency thereof to vary according to the monitor output signal. For example, the modulator circuit may allow an amplitude of the radio-frequency wave to vary according to the monitor output signal.

In the gate drive circuit in the first or second aspect, the modulator circuit may, for example, include: any one of a mixer circuit that mixes the input signal and a switch circuit that selectively outputs the radio frequency wave according to the input signal.

A gate drive circuit in a third aspect of the present disclosure, for example, includes: a first electromagnetic resonant coupler that isolatedly transmits a transmission signal from a primary side of the gate drive circuit to a secondary side of the gate drive circuit, and isolatedly transmits a reflected signal from the secondary side to the primary side, the primary side and the secondary side isolated from each other, the reflected signal generated by reflecting the transmission signal on the secondary side; a modulator circuit that modulates a radio-frequency wave with an input signal to generate the transmission signal and outputs the transmission signal to the first electromagnetic resonant coupler, the modulator circuit disposed on the primary side; a demodulator circuit that demodulates the transmission signal input from the first electromagnetic resonant coupler to generate an output signal and outputs the output signal to a semiconductor switch, the demodulator circuit disposed on the secondary side; a transistor into which the transmission signal is input from the first electromagnetic resonant coupler, the transistor disposed on the secondary side, the transistor turned on or off according to a monitor signal; and a reflected signal rectifier circuit that rectifies the reflected signal input from the first electromagnetic resonant coupler to generate a monitor output signal, the reflected signal rectifier circuit disposed on the primary side. A gate drive circuit in a fourth aspect of the present disclosure, for example, includes: a first electromagnetic resonant coupler that isolatedly transmits a transmission signal from a primary side of the gate drive circuit to a secondary side of the gate drive circuit, and isolatedly transmits a reflected signal from the secondary side to the primary side, the primary side and the secondary side isolated from each other, the reflected signal generated by reflecting the transmission signal on the secondary side; a modulator circuit that modulates a radio-frequency wave with an input signal to generate the transmission signal and outputs the transmission signal to the first electromagnetic resonant coupler, the modulator circuit disposed on the primary side; a demodulator circuit that demodulates the transmission signal input from the first electromagnetic resonant coupler to generate an output signal and outputs the output signal to a semiconductor switch, the demodulator circuit disposed on the secondary side; a reflected signal rectifier circuit that rectifies the reflected signal input from the first electromagnetic resonant coupler to generate a monitor output signal, the reflected signal rectifier circuit disposed on the primary side.

The gate drive circuit according to the present disclosure may be implemented as an integrated circuit.

Embodiments of the present disclosure will be specifically described below with reference to the drawings.

All embodiments described below illustrate comprehensive or specific examples. Numerals, shapes, materials, constituent elements, the placement positions and connection forms of these constituent elements, steps, and the sequence of these steps are only examples, and are not intended to restrict the present disclosure. Of the constituent elements in the embodiments below, constituent elements not described in independent claims, each of which indicates the topmost concept, will be described as arbitrary constituent elements.

First Embodiment

First, the structure of the gate drive circuit according to a first embodiment will be described.

Figure 2:
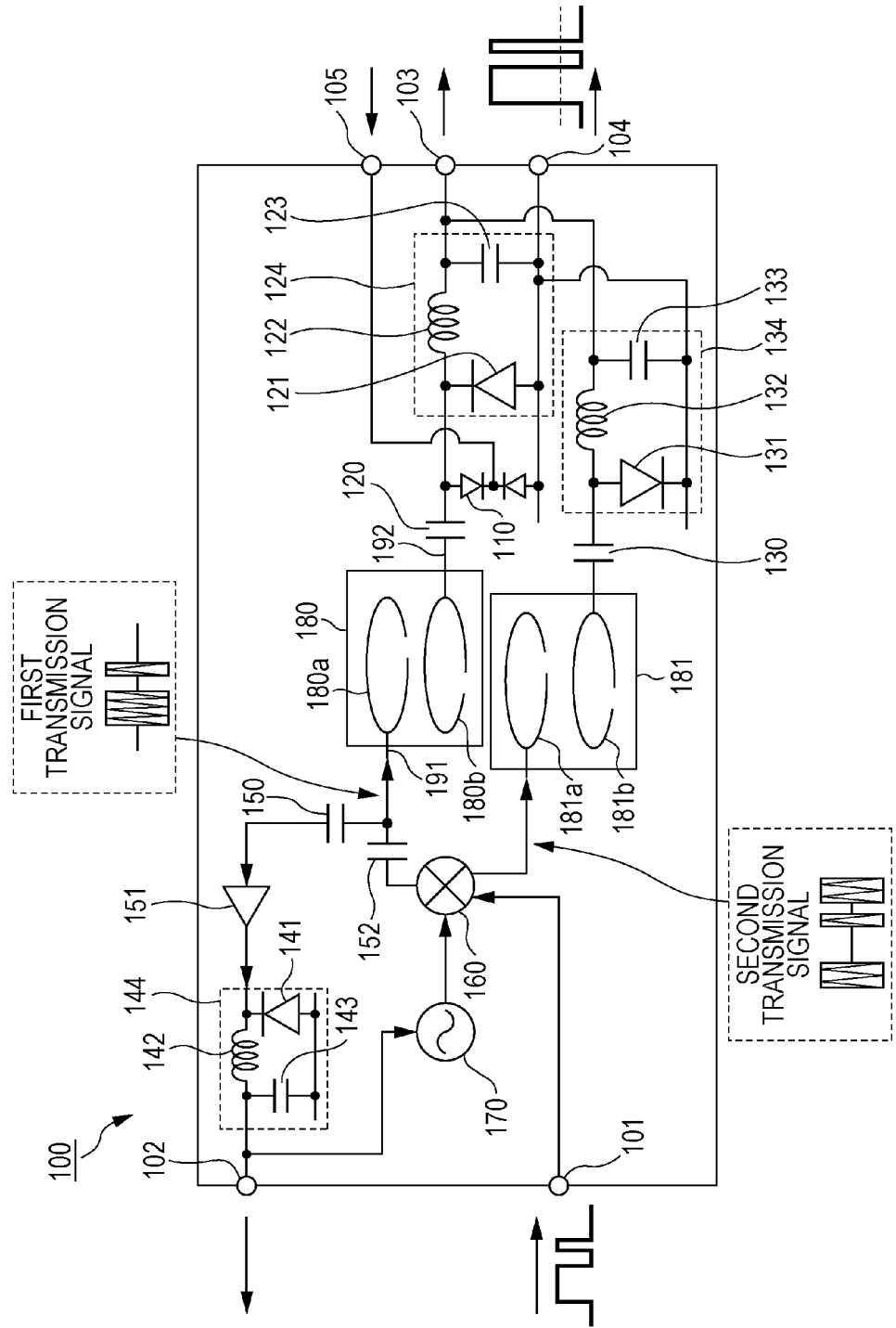
FIG. 2 illustrates an example of the structure of a gate drive circuit according to a first embodiment.

FIG. 2 illustrates an example of the structure of the gate drive circuit according to the first embodiment.

The gate drive circuit 100 includes an input terminal 101, a monitor output terminal 102, a first output terminal 103, a first output reference terminal 104, and a monitor terminal 105. The gate drive circuit 100 also includes a mixer circuit 160, a radio-frequency oscillator 170, a first electromagnetic resonant coupler 180, a third electromagnetic resonant coupler 181, a first rectifier circuit 124, a third rectifier circuit 134, an amplifier circuit 151, and a monitoring-specific rectifier circuit 144. The monitoring-specific rectifier circuit 144 is a type of reflected signal rectifier circuit. The mixer circuit 160 is a type of modulator circuit. The gate drive circuit 100 also includes a variable capacitance diode 110, an input capacitor 120, an input capacitor 130, a separating capacitor 150, and a capacitor 152. The variable capacitance diode 110 is a type of reflection circuit.

In the example described below, a side close to the input terminal 101 with respect to the first electromagnetic resonant coupler 180 and the third electromagnetic resonant coupler 181 will be described as a primary side. That is, the primary side of the gate drive circuit 100 includes the input terminal 101, the monitor output terminal 102, the mixer circuit 160, the radio-frequency oscillator 170, the amplifier circuit 151, the monitoring-specific rectifier circuit 144, the separating capacitor 150, and the capacitor 152.

A side close to the first output terminal 103 with respect to the first electromagnetic resonant coupler 180 and the third electromagnetic resonant coupler 181 will be described as a secondary side. That is, the secondary side of the gate drive circuit 100 includes the first output terminal 103, the first output reference terminal 104, the monitor terminal 105, the variable capacitance diode 110, the input capacitor 120, the input capacitor 130, the first rectifier circuit 124, and the third rectifier circuit 134.

The circuit elements on the primary side of the gate drive circuit 100 operate on the basis of a reference voltage which is a voltage of a first ground on the primary side. The circuit elements on the secondary side of the gate drive circuit 100 operate on the basis of a reference voltage which is a voltage of a second ground on the secondary side. The first ground and the second ground are differs from each other.

The input terminal 101, which is disposed on the primary side, receives an input signal. The input signal may take a two-valued voltage value.

The radio-frequency oscillator 170 generates a radio-frequency wave, and then the mixer circuit 160 acquires the radio-frequency wave. The radio-frequency wave, which has a prescribed amplitude and a prescribed frequency, is used as a carrier of the input signal. The radio-frequency wave has a waveform having a higher frequency than the input signal. The radio-frequency wave has a frequency of, for example, 100 MHz or more.

The mixer circuit 160 acquires the radio-frequency wave generated by the radio-frequency oscillator 170 and then generates a first transmission signal by modulating the radio-frequency wave according to the input signal entered from the input terminal 101. Specifically, to generate the first transmission signal, the mixer circuit 160 modulates the radio-frequency wave by mixing the radio-frequency wave and the input signal together. The mixer circuit 160 outputs the first transmission signal through the capacitor 152 to the first electromagnetic resonant coupler 180.

The mixer circuit 160 also acquires the radio-frequency wave generated by the radio-frequency oscillator 170 and generates a third transmission signal by modulating the radio-frequency wave according to a signal obtained by inverting the input signal. The mixer circuit 160 outputs the third transmission signal to the third electromagnetic resonant coupler 181.

The radio-frequency oscillator 170 and the mixer circuit 160 are disposed on the primary side of the gate drive circuit 100.

The mixer circuit 160 is an example of a modulator circuit. The modulator circuit is not limited to the structure described above. For example, a switch circuit may be used as the modulator circuit instead of the mixer circuit 160.

In this case, the switch circuit generates the first transmission signal by enabling and disabling the output of the radio-frequency wave acquired from the radio-frequency oscillator 170 to the first electromagnetic resonant coupler 180 according to the input signal entered into the input terminal 101. For example, the switch circuit outputs the radio-frequency wave to the first electromagnetic resonant coupler 180 while the input signal is at a high level, and outputs the radio-frequency wave to the third electromagnetic resonant coupler 181 while the input signal is at a low level.

Alternatively, an amplifier circuit may be used as the modulator circuit instead of the mixer circuit 160. In this case, the amplifier acquires the radio-frequency wave and then generates the first transmission signal by amplifying the radio-frequency wave according to the input signal entered into the input terminal 101.

The first electromagnetic resonant coupler 180 isolatedly transmits the first transmission signal entered from the primary side to the secondary side, which is isolated from the primary side. In the description below, isolation means that the signal lines on the primary side and the signal lines on the secondary side are electrically isolated from each other in terms of direct current and the ground on the primary side and the ground on the secondary side are electrically isolated from each other in terms of direct current. The first electromagnetic resonant coupler 180 includes two open-ring resonators 180a and 180b. The open-ring resonator 180a has a first terminal 191, and the open-ring resonator 180b has a second terminal 192.

The third electromagnetic resonant coupler 181 isolatedly transmits the third transmission signal entered from the primary side to the secondary side, which is isolated from the primary side. The third electromagnetic resonant coupler 181 includes two open-ring resonators 181a and 181b.

The first electromagnetic resonant coupler 180 and the third electromagnetic resonant coupler 181 are each, for example, an open-ring electromagnetic resonant coupler as described in, for example, Japanese Unexamined Patent Application Publication No. 2008-067012. However, the first electromagnetic resonant coupler 180 and the third electromagnetic resonant coupler 181 may be any device that can isolatedly transmit a signal with electromagnetic resonance coupling; for example, they may have a rectangular loop shape or the like.

The line lengths of the resonators 180a and 180b may be set to a half of the wavelength of a signal to be transmitted. Therefore, the higher the frequency of the signal to be transmitted is, the smaller the size of the resonators 180a and 180b is. If, therefore, the first transmission signal has a radio-frequency component at, for example, about 2.4 GHz, the size of the first electromagnetic resonant coupler 180 is very small when compared with conventional signal isolators. This is also true for the line lengths of the resonators 181a and 181b. If, therefore, the radio-frequency component of the third transmission signal is at, for example, about 2.4 GHz, the size of the third electromagnetic resonant coupler 181 is very small when compared with conventional signal isolators.

The first rectifier circuit 124 acquires the first transmission signal, which has been isolatedly transmitted from the primary side to the secondary side with the first electromagnetic resonant coupler 180. The first rectifier circuit 124 demodulates the first transmission signal by rectifying it, and then outputs the demodulated signal to the first output terminal 103 as a first output signal. The first rectifier circuit 124 is disposed on the secondary side of the gate drive circuit 100. The first rectifier circuit 124, for example, includes a diode 121, an inductor 122, and a smoothing capacitor 123. In the example in FIG. 2, the first output signal has a positive voltage or 0 V with respect to the voltage at the first output reference terminal 104. Therefore, the first rectifier circuit 124 may also be referred to as the positive-side rectifier circuit.

The third rectifier circuit 134 acquires the third transmission signal, which has been isolatedly transmitted from the primary side to the secondary side with the third electromagnetic resonant coupler 181. The third rectifier circuit 134 demodulates the third transmission signal by rectifying it, and then outputs the demodulated signal to the first output terminal 103 as a second output signal. The third rectifier circuit 134 is disposed on the secondary side of the gate drive circuit 100. The third rectifier circuit 134, for example, includes a diode 131, an inductor 132, and a smoothing capacitor 133. In the example in FIG. 2, the second output signal has a negative voltage or 0 V with respect to the voltage at the first output reference terminal 104. Therefore, the third rectifier circuit 134 may also be referred to as the negative-side rectifier circuit.

The first output terminal 103 and the first output reference terminal 104 are disposed on the secondary side of the gate drive circuit 100. The first output terminal 103 and the first output reference terminal 104 are paired terminals to which an output signal including the first output signal and the second output signal is output. For example, the first output signal becomes the positive voltage component of the output signal based on the first output reference terminal 104, and the second output signal becomes the negative voltage component of the output signal based on the first output reference terminal 104. That is, an output signal for driving a semiconductor switching element is output from the first output terminal 103 according to the input signal.

In the example in FIG. 2, the first output terminal 103 is connected to the gate terminal of a semiconductor switching element, and the first output reference terminal 104 is connected to the source terminal of the semiconductor switching element.

In the example described below, the semiconductor switching element, connected to the first output terminal 103 and the first output reference terminal 104, is a gallium nitride (GaN) power transistor that is turned on when a gate voltage of 3 V is applied. However, any semiconductor switching element may be connected to the first output terminal 103 and the first output reference terminal 104.

The monitor terminal 105 is disposed on the secondary side of the gate drive circuit 100. A monitor signal is entered into the monitor terminal 105. The monitor signal is, for example, a signal in which a variation of a load connected to the first output terminal 103 has been incorporated.

The variable capacitance diode 110 is an example of a reflection circuit. The variable capacitance diode 110 adjusts a reflection amount of a reflected signal according to a signal entered into the monitor terminal 105. The variable capacitance diode 110 is disposed between the second terminal 192, a secondary-side terminal, of the first electromagnetic resonant coupler 180 and the first output reference terminal 104. The variable capacitance diode 110 may be a so-called varactor diode; its capacitance varies according to a signal entered into the monitor terminal 105.

The variable capacitance diode 110 may be disposed between the secondary-side terminal of the third electromagnetic resonant coupler 181 and the first output reference terminal 104. In this case, the separating capacitor 150 and the capacitor 152 are connected to the primary-side terminal of the third electromagnetic resonant coupler 181.

When the first transmission signal is isolatedly transmitted to the secondary side, the first transmission signal is reflected on the secondary side, causing the reflected signal to be isolatedly transmitted through the first electromagnetic resonant coupler 180 from the secondary side to the primary side. The reflected signal is generated according to the variation of the load connected to the first output terminal 103. The monitoring-specific rectifier circuit 144 rectifies the reflected signal. The monitoring-specific rectifier circuit 144 is disposed on the primary side of the gate drive circuit 100.

The reflected signal is output from the first terminal 191 of the first electromagnetic resonant coupler 180, passed through the separating capacitor 150, and then entered into the amplifier circuit 151. The reflected signal is then amplified by the amplifier circuit 151 and output from the amplifier circuit 151 to the monitoring-specific rectifier circuit 144.

A reflection amount of the reflected signal varies according to the voltage value of the monitor signal. A reflection amount of the reflected signal is, for example, the amplitude of the reflected signal. As described above, the gate drive circuit 100 includes the separating capacitor 150 and the capacitor 152. The separating capacitor 150 adjusts an amount of the reflected signal input from the first electromagnetic resonant coupler 180 to the monitoring-specific rectifier circuit 144, and the capacitor 152 adjusts an amount of the reflected signal input from the first electromagnetic resonant coupler 180 toward the mixer circuit 160. The capacities of the separating capacitor 150 and the capacitor 152 are set so that the reflected signal is input from the first electromagnetic resonant coupler 180 to the mixer circuit 160 as little as possible. The separating capacitor 150 and the capacitor 152 are each a type of signal separator.

The monitor output terminal 102 outputs the monitor output signal, that is the reflected signal that has been rectified by the monitoring-specific rectifier circuit 144. The monitor output terminal 102 is disposed on the primary side of the gate drive circuit 100.

In the example in FIG. 2, the oscillation frequency of the radio-frequency oscillator 170 varies according to the monitor output signal. The method of varying the oscillation frequency of the radio-frequency oscillator 170 will be descried later in detail.

Although not illustrated in FIG. 2, a resistor may be inserted between the first output terminal 103 and the first output reference terminal 104. Similarly, another resistor may be inserted between the monitor terminal 105 and the first output reference terminal 104. A capacitor may be provided between the mixer circuit 160 and the third electromagnetic resonant coupler 181.

The amplifier circuit 151, the separating capacitor 150, and the capacitor 152 may be omitted. These elements are appropriately used to adjust the above reflected signal. The monitoring-specific rectifier circuit 144 is not restricted to the circuit structure described above; it may have another structure.

Next, the features of the gate drive circuit 100 will be described.

The gate drive circuit 100 generates an output signal according to an input signal. The output signal drives the gate of a semiconductor switching element connected with the first output terminal 103 and the first output reference terminal 104. The input signal is, for example, a two-valued control signal. The semiconductor switching element is, for example, a gallium nitride (GaN) power transistor.

The first output reference terminal 104 gives the reference potential of the output signal to the semiconductor switching element. The first output reference terminal 104 is isolated from the ground on the primary side by the first electromagnetic resonant coupler 180 and the third electromagnetic resonant coupler 181, and is thereby in a floating state with respect to the ground on the primary side.

When an input signal is entered from the input terminal 101 on the primary side, the gate drive circuit 100 can output an output voltage with a waveform similar to the waveform of the input signal to the first output terminal 103 on the secondary side.

When the monitor signal is entered into the monitor terminal 105 on the secondary side, a monitor output signal is output from the monitor output terminal 102 on the primary side. In other words, when a monitor voltage is applied across the first output reference terminal 104 and the monitor terminal 105, a monitor output voltage is output across the monitor output terminal 102 and the reference potential on the primary side. The gate drive circuit 100 may vary the output signal according to the monitor output signal.

Even if there is a certain distance between electromagnetic resonant couplers, they can achieve highly efficient electric power transmission. Therefore, a gate drive circuit that includes electromagnetic resonant couplers, such as the gate drive circuit 100, can attain a high withstand voltage by prolonging the distance between the electromagnetic resonant couplers and can also achieve electric power transmission with a low loss.

With a gate drive circuit that includes electromagnetic resonant couplers, such as the gate drive circuit 100, when the frequency of a radio-frequency wave is increased, the sizes of the electromagnetic resonant couplers can be reduced.

Next, the operation of the gate drive circuit 100 will be described.

In the gate drive circuit 100, the radio-frequency wave generated by the radio-frequency oscillator 170 is modulated by the mixer circuit 160 according to the input signal.

The mixer circuit 160 modulates the radio-frequency wave acquired from the radio-frequency oscillator 170 according to the input signal, thereby generating the first transmission signal. The mixer circuit 160 also modulates the radio-frequency wave acquired from the radio-frequency oscillator 170 according to an inverted input signal obtained by inverting the input signal, thereby generating the third transmission signal.

That is, the mixer circuit 160 generates two amplitude-modulated signals, first transmission signal and the third transmission signal, which are complementary to each other. The mixer circuit 160 outputs the first transmission signal to the first electromagnetic resonant coupler 180 and also outputs the third transmission signal to the third electromagnetic resonant coupler 181.

The first transmission signal is isolatedly transmitted by the first electromagnetic resonant coupler 180, passed through the input capacitor 120, and then entered into the first rectifier circuit 124. The third transmission signal is isolatedly transmitted by the third electromagnetic resonant coupler 181, passed through the input capacitor 130, and then entered to the third rectifier circuit 134.

As described above, the first rectifier circuit 124 includes the diode 121, the inductor 122, and the smoothing capacitor 123.

The cathode of the diode 121 and one end of the inductor 122 are connected to the input end of the first rectifier circuit 124. One end of the smoothing capacitor 123 and the first output terminal 103 are connected to the other end of the inductor 122. The anode of the diode 121 and the other end of the smoothing capacitor 123 are connected to the first output reference terminal 104.

Therefore, the first rectifier circuit 124 generates the first output signal by rectifying a portion, of the first transmission signal, that has a positive voltage value with respect to the voltage at the first output reference terminal 104.

As described above, the third rectifier circuit 134 includes the diode 131, the inductor 132, and the smoothing capacitor 133.

The anode of the diode 131 and one end of the inductor 132 are connected to the input end of the third rectifier circuit 134. One end of the smoothing capacitor 133 and the first output terminal 103 are connected to the other end of the inductor 132. The cathode of the diode 131 and the other end of the smoothing capacitor 133 are connected to the first output reference terminal 104.

Therefore, the third rectifier circuit 134 generates the second output signal by rectifying a portion, of the third transmission signal, that has a negative voltage value with respect to the voltage at the first output reference terminal 104.

To operate the diode 121 and the diode 131 in a high-frequency domain, a Schottky barrier diode or another diode with a small junction capacitance may be used as the diode 121 and the diode 131.

If, for example, the radio-frequency wave is at 2.4 GHz, a GaN Schottky barrier diode may be used as the diode 121 and the diode 131. In this case, if the inductor 122 and the inductor 132 have an inductance of 5.8 nH and the input capacitor 120 and the input capacitor 130 have a capacitance of 0.4 pF, the first rectifier circuit 124 and the third rectifier circuit 134 each operate as a rectifier circuit that rectifies a signal including a high-frequency component at 2.4 GHz.

The first rectifier circuit 124 and the third rectifier circuit 134 are not limited to these circuit structures. Any other circuit structures can be used if they can rectify a modulated signal including a high-frequency component to demodulate it.

The gate drive circuit 100 not only outputs an output signal from the secondary side to the outside but also has a function to monitor the secondary side by transmitting a secondary-side signal (voltage) to the primary side, which is isolated from the secondary side.

In the gate drive circuit 100, an output signal is output from the first output terminal 103 to the outside thereof. A reflected signal is generated by reflecting the first transmission signal on the secondary side, is transferred from the secondary side to the primary side by the first electromagnetic resonant coupler 180, and is then output from the first terminal 191. A variation of the load connected to the first output terminal 103 is incorporated in the reflected signal. The reflected signal output from the first terminal 191 is passed through the separating capacitor 150 and then entered into the amplifier circuit 151. The reflected signal is then amplified by the amplifier circuit 151 and is then entered into the monitoring-specific rectifier circuit 144.

The monitoring-specific rectifier circuit 144 includes a diode 141, an inductor 142, and a smoothing capacitor 143.

The cathode of the diode 141 and one end of the inductor 142 are connected to the input end of the monitoring-specific rectifier circuit 144. One end of the smoothing capacitor 143 and the monitor output terminal 102 are connected to the other end of the inductor 142. The anode of the diode 121 and the other end of the smoothing capacitor 123 are connected to the ground on the primary side.

Therefore, the monitoring-specific rectifier circuit 144 generates the monitor output signal, or monitor output voltage, in which a portion of the reflected signal has been rectified, the portion having a positive voltage value with respect to the ground on the primary side, for example.

The gate drive circuit 100 can adjust the oscillation frequency and the amplitude of the radio-frequency wave according to the monitor output voltage. Due to this structure, the gate drive circuit 100 can vary the radio-frequency wave according to a variation of the load connected to the first output terminal 103 and can thereby optimize the output signal.

In the gate drive circuit 100, the variable capacitance diode 110 is connected in parallel to the diode 121 in the first rectifier circuit 124. The capacitance of the variable capacitance diode 110 varies according to the monitor voltage applied to the monitor terminal 105.

When the capacitance of the variable capacitance diode 110 varies, the input impedance of the first rectifier circuit 124 also varies, so a reflection amount of the first transmission signal which is reflected at the input part of the first rectifier circuit 124 varies. That is, in the gate drive circuit 100, when the monitor voltage is applied to the monitor terminal 105, a reflection amount of the reflected signal can vary.

In other words, in the gate drive circuit 100, the monitor voltage applied to the monitor terminal 105 on the secondary side can be monitored as the monitor output voltage, which is output from the monitor output terminal 102 on the primary side.

Figure 3:
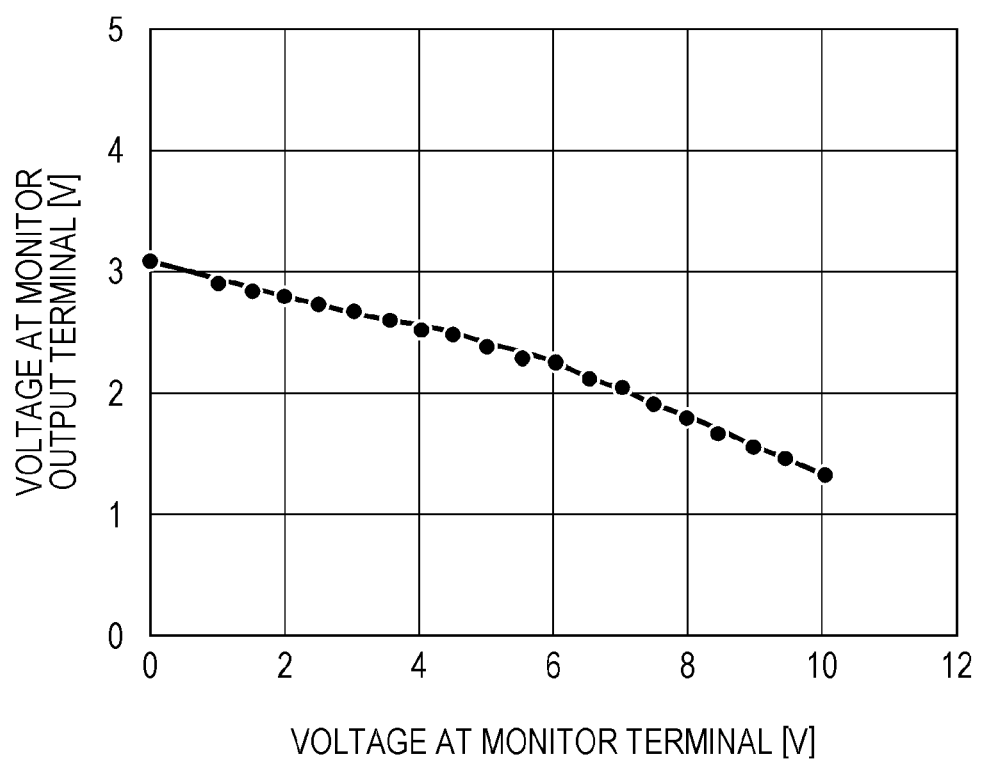
FIG. 3 illustrates an example of a relationship, in the gate drive circuit according to the first embodiment, between voltage applied to a monitor terminal and a monitor output voltage output from a monitor output terminal.

FIG. 3 illustrates an example of a relationship, in the gate drive circuit 100, between voltage applied to the monitor terminal 105 and monitor output voltage output from the monitor output terminal 102.

As illustrated in FIG. 3, the voltage output from the monitor output terminal 102 varies according to the voltage applied to the monitor terminal 105. For example, the larger the voltage applied to the monitor terminal 105 is, the smaller the voltage output from the monitor output terminal 102 is.

It is found from FIG. 3 that the voltage applied to the monitor terminal 105 on the secondary side can be monitored at the monitor output terminal 102 on the primary side, which is isolated from the secondary side.

That is, if any portion in a circuit connected to the secondary side of the gate drive circuit 100 is connected to the monitor terminal 105, a voltage in the part can be monitored at the monitor output terminal 102 on the primary side. To monitor the gate voltage of a semiconductor switching element connected to the first output terminal 103, for example, it is only necessary that the monitor terminal 105 and the first output terminal 103 are mutually connected with a resistance component intervening between them.

Next, an example of the circuit structure of a transmitting part in the gate drive circuit 100 illustrated in FIG. 2 will be described with reference to FIG. 4. The transmitting part in the gate drive circuit 100 includes the mixer circuit 160, the radio-frequency oscillator 170, and the amplifier circuit 151.

Figure 4:
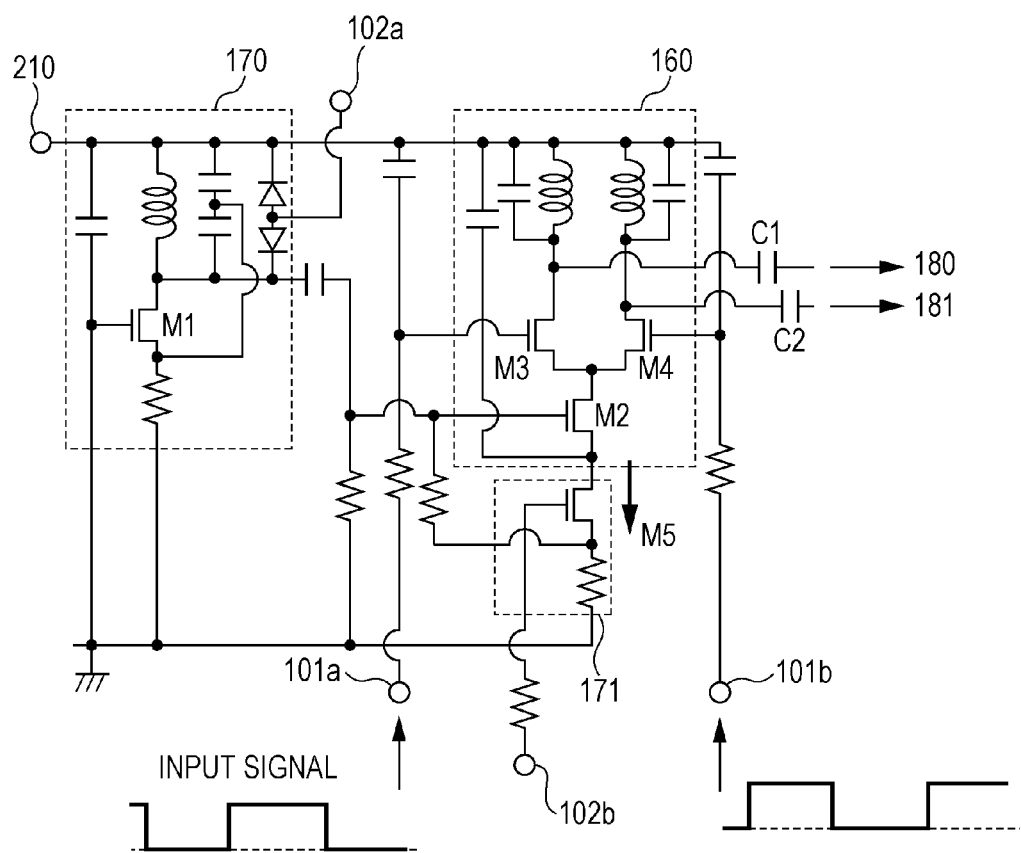
FIG. 4 illustrates an example of the circuit structure of a transmitting part in the gate drive circuit according to the first embodiment.

FIG. 4 illustrates an example of the circuit structure of the transmitting part in the gate drive circuit 100. It is assumed that, in the circuit in FIG. 4, an input signal is entered into an input terminal 101a and an inverted signal is entered into an input terminal 101b. The inverted input signal is generated in an invert circuit (not illustrated), which may be separately provided.

A power supply unit used to operate the transmitting part is connected to a power supply terminal 210.

The radio-frequency oscillator 170, which includes a transistor M1, is a so-called Colpitts oscillator circuit; it generates a radio-frequency wave.

The mixer circuit 160, which includes transistors M2, M3, and M4, is an active mixer. The radio-frequency wave is amplified by the transistor M2. The radio-frequency wave amplified by the transistor M2 is output to the first electromagnetic resonant coupler 180 when the transistor M3 is turned on, and is output to the third electromagnetic resonant coupler 181 when the transistor M4 is turned on.

That is, the radio-frequency wave amplified by the transistor M2 is output to the first electromagnetic resonant coupler 180 when a positive voltage is applied to the input terminal 101a, and is output to the third electromagnetic resonant coupler 181 when a positive voltage is applied to the input terminal 101b.

Therefore, the first transmission signal and the third transmission signal having waveforms as illustrated in FIG. 2 are output from the transmitting part.

In this case, a terminal 102a is connected to a variable capacitance diode (not shown) included in the radio-frequency oscillator 170, so when the capacitance of the variable capacitance diode varies, the frequency of the radio-frequency wave generated by the radio-frequency oscillator 170 varies.

That is, when the terminal 102a and the monitor output terminal 102 are electrically connected to each other, the oscillation frequency of the radio-frequency wave can be varied according to the monitor output signal output from the monitor output terminal 102.

The amount of amplification by the transistor M2 and its power consumption depend on the drain current of the transistor M2. In the transmitting part in FIG. 4, the amount of the drain current flowing in the transistor M2 depends on the on-resistance of the transistor M5.

Therefore, when a signal is entered from a terminal 102b into the gate terminal of the transistor M5, the transistor M5, for example, is switched between the on state and the off state, varying the on-resistance of the transistor M5. Thus, the amount of the drain current flowing in the transistor M2 varies and the amount of amplification by the transistor M2 and its power consumption are thereby varied.

That is, when the terminal 102*b* and the monitor output terminal 102 are electrically connected to each other, the amplitudes of the first transmission signal and the third transmission signal generated by the mixer circuit 160 can be varied according to the monitor output signal entered from the terminal 102*b*.

FIG. 4 illustrates an example in which the amplitudes of the first transmission signal and the third transmission signal generated by the mixer circuit 160 vary according to the monitor output signal. As another example, the transmitting part may include a circuit that varies the amplitude of the radio-frequency wave generated by the radio-frequency oscillator 170 according to the monitor output signal. The transmitting part may also separately include an amplifier circuit or the like that increases or decreases the amplitude of the radio-frequency wave.

Although not illustrated in FIG. 2, a capacitor C1 may be provided between the mixer circuit 160 and the first electromagnetic resonant coupler 180 as illustrated in FIG. 4. Similarly, a capacitor C2 may be provided between the mixer circuit 160 and the third electromagnetic resonant coupler 181.

As described above, in the gate drive circuit 100, the monitoring-specific rectifier circuit 144 outputs the monitor output signal to the monitor output terminal 102. Therefore, a voltage in a circuit connected to the secondary side can be monitored on the primary side. For example, a voltage in which a variation of a load connected to the first output terminal 103 is incorporated can be monitored on the primary side.

In this structure in which a reflected signal is used, the same isolator is used for both transmission of a transmitting signal and transmission of the reflected signal, so fewer elements are added than when an isolator to monitor a voltage applied to the secondary side is separately added. Accordingly, the gate drive circuit 100 is suitable for size reduction and integration.

In the gate drive circuit 100, the receiving part on the secondary side do not need to be actively operated to monitor the monitor output signal, so the gate drive circuit 100 can be operated with low power consumption.

A variation in the monitor signal entered into the secondary side is incorporated at high speed in the monitor output signal output from the monitor output terminal 102 on the primary side. Furthermore, when the monitor output terminal 102 is connected to the radio-frequency oscillator 170, the monitor output signal is used for output signal control, enabling high-speed superior output signal control.

Since the gate drive circuit 100 uses reflection of a radio-frequency wave for monitoring, a signal in which a situation on the secondary side has been incorporated at high speed can be monitored on the primary side.

A directional coupler may be used instead of the separating capacitor 150 and the capacitor 152. A directional coupler is a type of signal separator.

Figure 5:
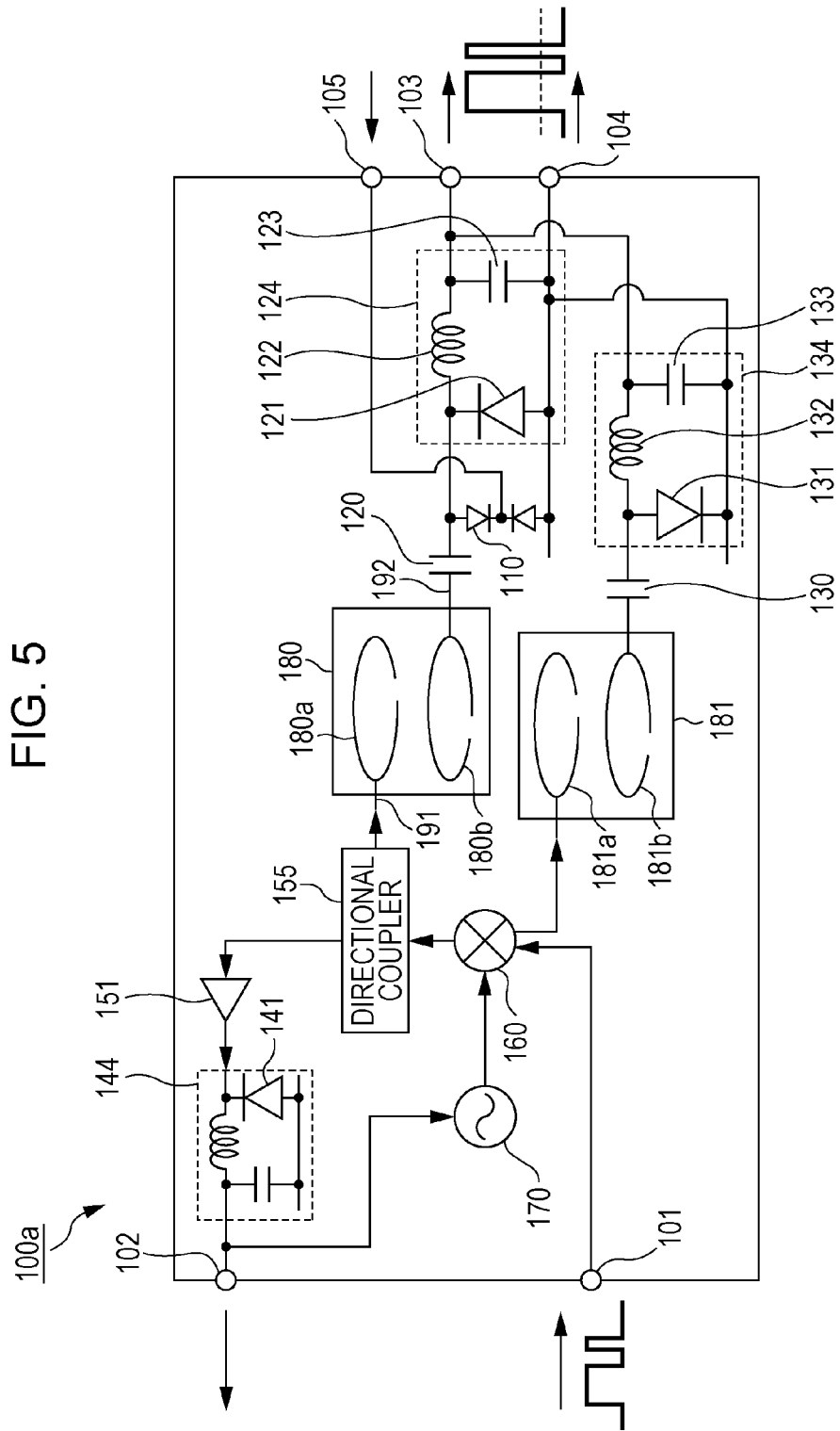
FIG. 5 illustrates an example of the structure of a gate drive circuit that includes a directional coupler.
Figure 6:
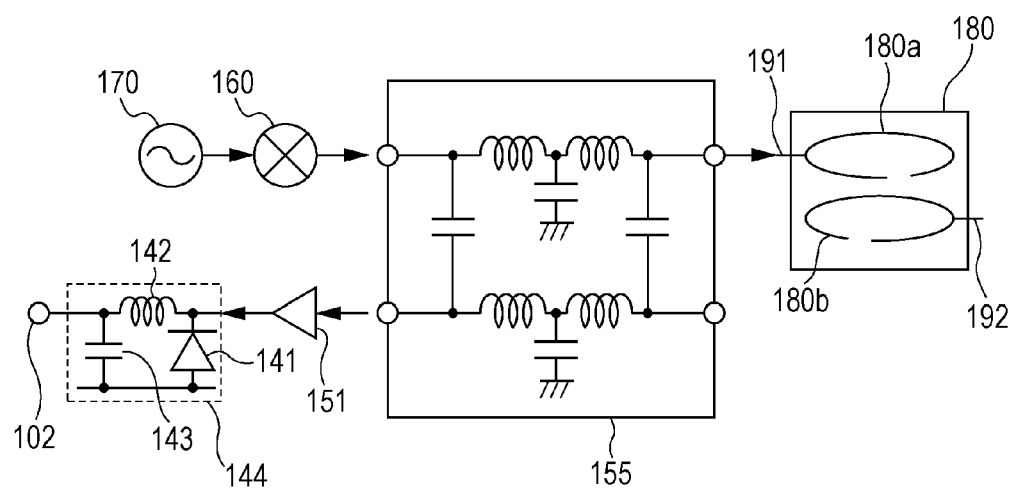
FIG. 6 illustrates an example of a structure around the directional coupler in the gate drive circuit in FIG. 5.

FIG. 5 illustrates an example of the structure of a gate drive circuit including a directional coupler. FIG. 6 illustrates an example of a structure around the directional coupler in the gate drive circuit in FIG. 5.

A directional coupler 155 is an element that can take out a progressive wave and a reflected wave from a signal on a transmission line. The directional coupler 155 is disposed between the mixer circuit 160 and the first electromagnetic resonant coupler 180. The directional coupler 155 allows the first transmission signal to pass from the mixer circuit 160 to the first electromagnetic resonant coupler 180 and also allows the reflected signal to pass from the first electromagnetic resonant coupler 180 to the monitoring-specific rectifier circuit 144.

Since the gate drive circuit 100*a* includes the directional coupler 155, the reflected signal can efficiently be input into the monitoring-specific rectifier circuit 144.

The directional coupler 155 includes, for example, a lumped constant element as illustrated in, for example, FIG. 6. The directional coupler 155 may be a directional coupler using microstrip parallel coupled line, a rat-race directional coupler, or another type of directional coupler.

Although the first electromagnetic resonant coupler 180 in the gate drive circuit 100 in FIG. 2 has two terminals, the first terminal and the second terminal, the first electromagnetic resonant coupler 180 may have three or more terminals.

Figure 7:
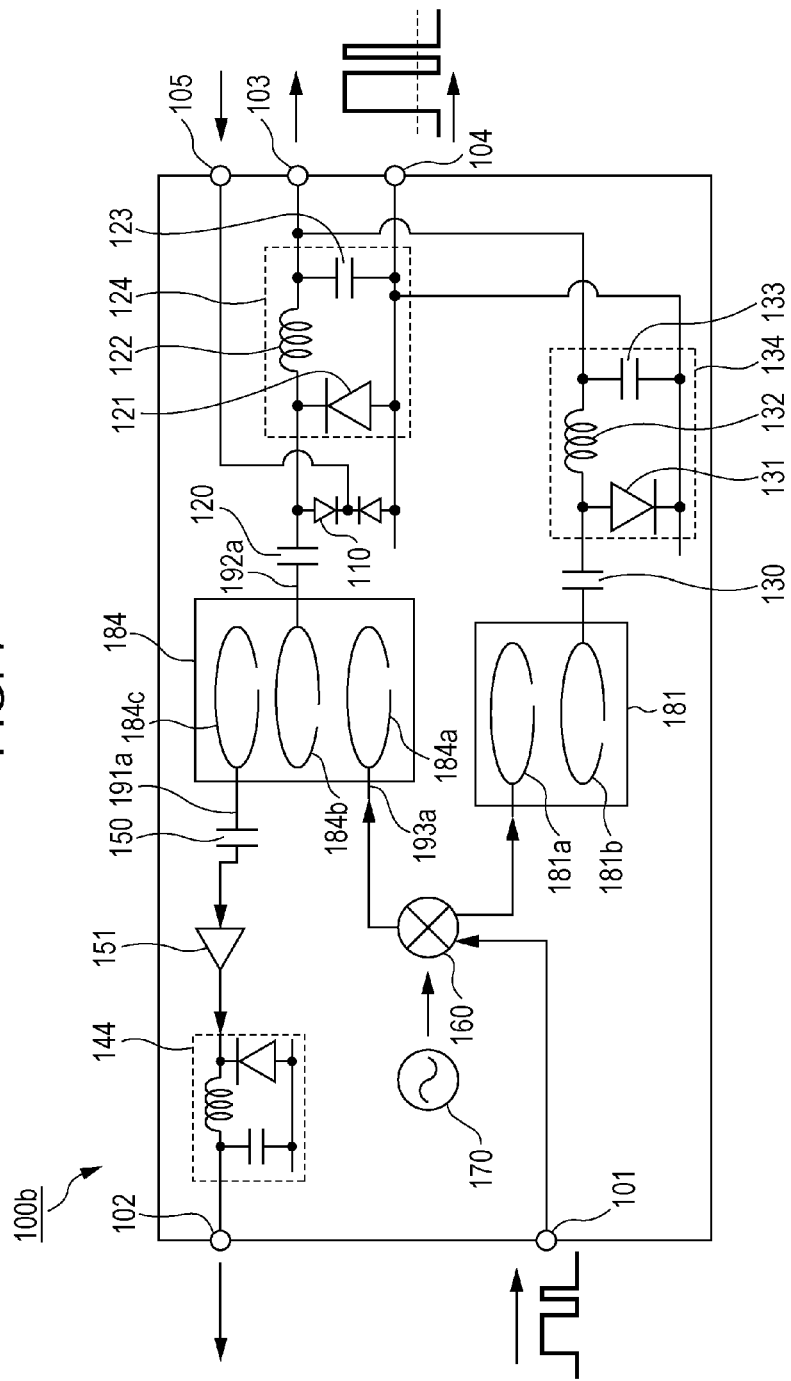
FIG. 7 illustrates an example of the structure of a gate drive circuit that includes a first electromagnetic resonant coupler having three terminals.

FIG. 7 illustrates an example of the structure of a gate drive circuit that includes a first electromagnetic resonant coupler having three terminals.

As illustrated in FIG. 7, a first electromagnetic resonant coupler 184 included in a gate drive circuit 100*b* is formed with three open-ring resonators 184*a* to 184*c*. The first electromagnetic resonant coupler 184 has three terminals, a first terminal 191*a* provided in the open-ring resonator 184*c*, a second terminal 192*a* provided in the open-ring resonator 184*b* and a third terminal 193*a* provided in the open-ring resonator 184*a*.

The first terminal 191*a* is disposed on the primary side of the gate drive circuit 100*b*; the first transmission signal is entered from the mixer circuit 160 into the first terminal 191*a*.

The second terminal 192*a* is disposed on the secondary side of the gate drive circuit 100*b*; the first transmission signal entered from the first terminal 191*a* is isolatedly transmitted and is then output from the second terminal 192*a*.

The third terminal 193*a* is disposed on the primary side of the gate drive circuit 100*b*; a reflected signal is output from the third terminal 193*a*.

The first electromagnetic resonant coupler 184 can isolatedly transmit the first transmission signal entered from the mixer circuit 160, and can output the first transmission signal to the first rectifier circuit 124. The first electromagnetic resonant coupler 184 can also isolatedly transmit a reflected signal, which is generated as a result of the first transmission signal being reflected in the first rectifier circuit 124, and can output the reflected signal to the monitoring-specific rectifier circuit 144. That is, the first electromagnetic resonant coupler 184 has a function similar to the function of the directional coupler 155. Therefore, with the first electromagnetic resonant coupler 184, a reflected signal can be efficiently entered into the monitoring-specific rectifier circuit 144.

Although the variable capacitance diode 110 is used as the reflection circuit in the gate drive circuit 100, a transistor 111 may be used as the reflection circuit, instead of the variable capacitance diode 110.

Figure 8:
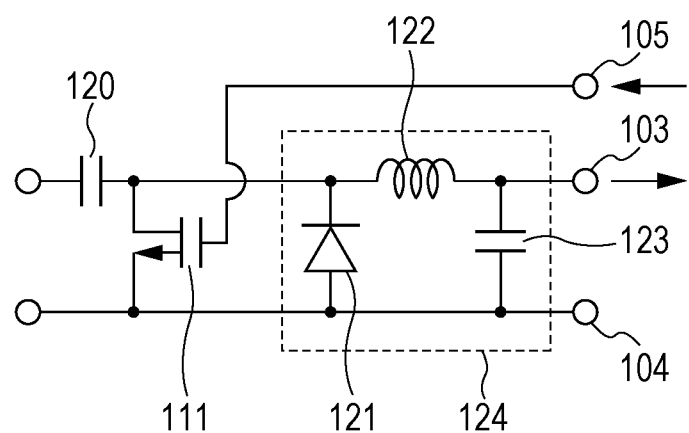
FIG. 8 illustrates an example of a structure around a first rectifier circuit in a case in which a transistor is used instead of a variable capacitance diode.

FIG. 8 illustrates an example of a structure around the first rectifier circuit 124 in a case in which the gate drive circuit 100 has a transistor instead of the variable capacitance diode 110.

The transistor 111 illustrated in FIG. 8 is disposed between the second terminal, the secondary-side terminal, of the first electromagnetic resonant coupler 180 and the ground on the secondary side. The transistor 111 is selectively turned on and off according to the signal entered into the monitor output terminal 102.

When the transistor 111 is used in the gate drive circuit 100 instead of the variable capacitance diode 110 in this way, if a voltage applied to the monitor output terminal 102 is low, the gate drive circuit 100 can produce a large variation in input impedance.

The variable capacitance diode 110, the transistor 111, and the other reflection circuits may be omitted. The input capacitor 130, the third electromagnetic resonant coupler 181, and the third rectifier circuit 134 may also be omitted. It is only necessary that the gate drive circuit 100 includes at least one electromagnetic resonant coupler that isolatedly transmits a transmission signal from the primary side to the secondary side and at least one demodulator circuit that demodulates the transmission signal.

Figure 9:
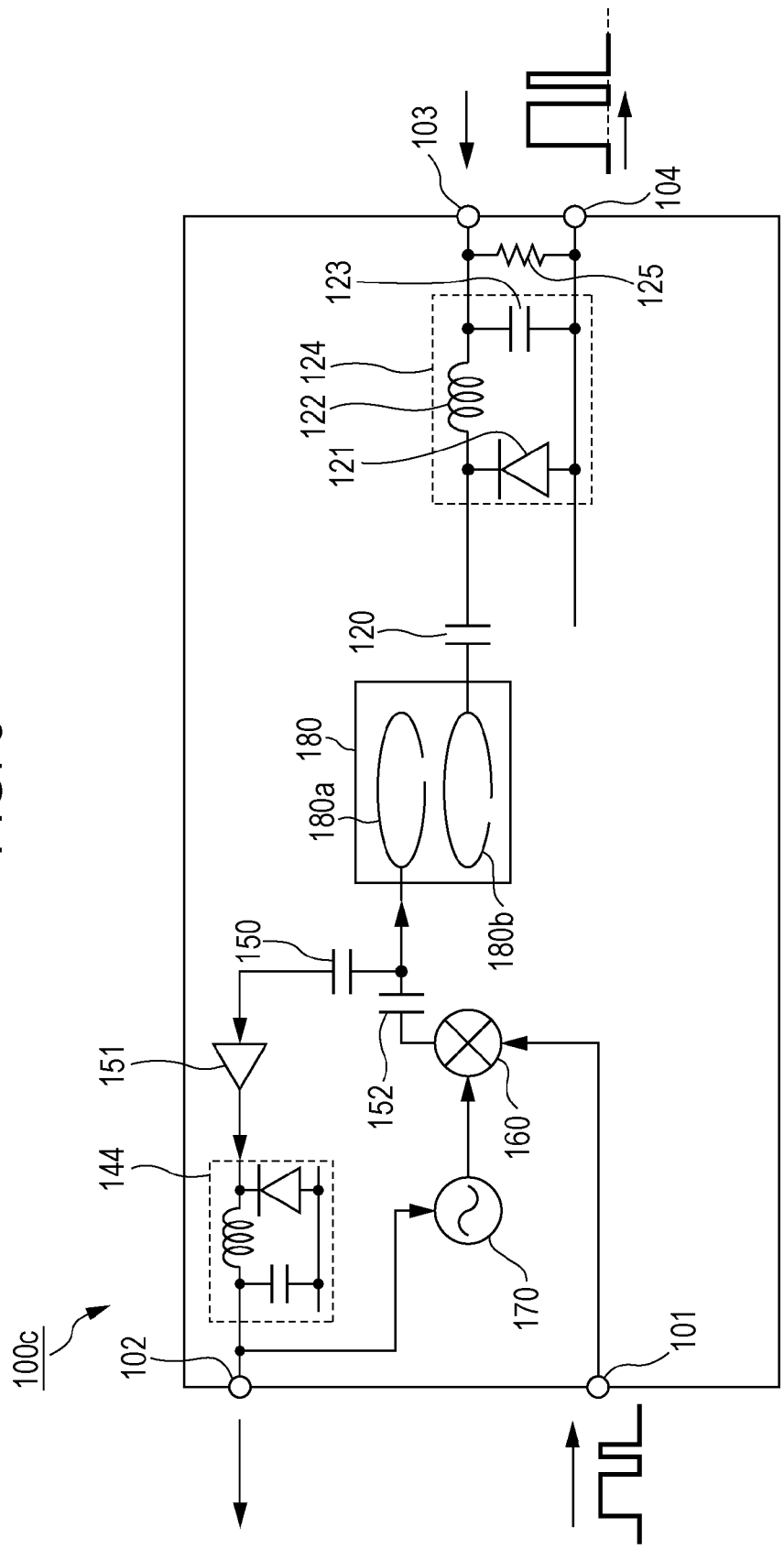
FIG. 9 illustrates an example of the structure of a gate drive circuit that does not include a reflection circuit.

FIG. 9 illustrates an example of the structure of a gate drive circuit that does not include reflection circuits separately.

The gate drive circuit 100c in FIG. 9 does not include reflection circuits. However, a signal depending on a variation of a load connected to the first output terminal 103 is entered into the first output terminal 103, and thus a reflected signal in which the signal is incorporated is generated on the secondary side. Therefore, a variation of the load can be monitored through the monitor output terminal 102.

The gate drive circuit 100c also does not include the third electromagnetic resonant coupler 181. In this case, it is predicted that when the semiconductor switching element connected to the first output terminal 103 is switched from the on state to the off state, the falling edge of a switching waveform is slowed. To hasten the falling edge of the switching waveform when the semiconductor switching element is turned off, a resistor 125 is provide in the gate drive circuit 100c.

Although the gate drive circuits 100, 100a, 100b, and 100c include the radio-frequency oscillator 170, it may be omitted. The mixer circuit 160 may acquire a radio-frequency wave from the outside of the gate drive circuits.

The monitor output terminal 102 may be built into the gate drive circuit 100. That is, the monitor output terminal 102 may not be provided as a terminal for receiving a signal from the outside of the gate drive circuit 100.

An isolator may be an element, other than an electromagnetic resonant coupler, that can transmit a radio-frequency wave in an isolation manner.

Second Embodiment

The first electromagnetic resonant coupler 180 in the first embodiment fulfils a function of isolatedly transmitting a transmission signal from the primary side to the secondary side and a function of isolatedly transmitting a reflected signal from the secondary side to the primary side. However, the first electromagnetic resonant coupler 180 may not transmit the gate driving signal from the primary side to the secondary side. For example, the first electromagnetic resonant coupler 180 may be used only for monitoring. In this case, an electromagnetic resonant coupler for gate driving is separately provided in the gate drive circuit. In addition, a switch circuit may be used instead of the mixer circuit 160.

A gate drive circuit according to a second embodiment, which is characterized as described above, will be described below. The second embodiment will be described, focusing on differences from the gate drive circuit 100. Descriptions of the same constituent elements as in the gate drive circuit 100 will be sometimes omitted.

Figure 10:
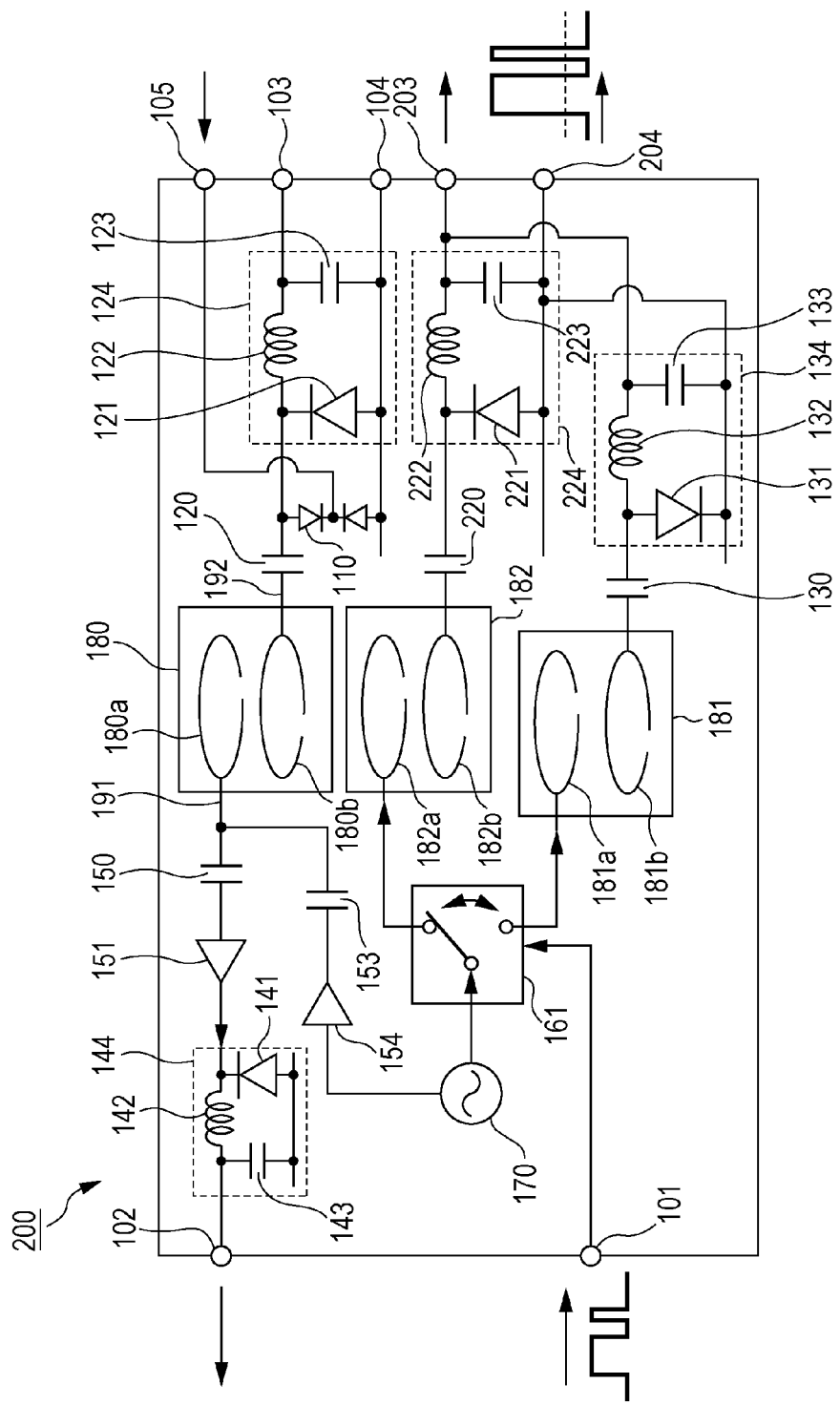
FIG. 10 illustrates an example of the structure of a gate drive circuit in which the first electromagnetic resonant coupler is specifically used to monitor the reflected signal.

FIG. 10 illustrates an example of the structure of a gate drive circuit in which the first electromagnetic resonant coupler 180 is specifically used to monitor the reflected signal.

The gate drive circuit 200 in the second embodiment includes an input terminal 101, a monitor output terminal 102, a first output terminal 103, a first output reference terminal 104, a monitor terminal 105, a second output terminal 203 and a second output reference terminal 204. The gate drive circuit 200 in the second embodiment includes a radio-frequency oscillator 170, a first electromagnetic resonant coupler 180, a third electromagnetic resonant coupler 181, a switch circuit 161 and a second electromagnetic resonant coupler 182. The gate drive circuit 200 in the second embodiment includes a first rectifier circuit 124, a third rectifier circuit 134, an amplifier circuit 151, a monitoring-specific rectifier circuit 144, a second rectifier circuit 224 and an amplifier circuit 154. The gate drive circuit 200 in the second embodiment includes a variable capacitance diode 110, an input capacitor 120, an input capacitor 130, a separating capacitor 150, an input capacitor 220 and a capacitor 153. The switch circuit 161 is a type of modulator circuit.

First, the structure of a portion, in the gate drive circuit 200, that is used for gate driving will be described.

The radio-frequency oscillator 170 generates a radio-frequency wave used for a transmission signal, and the switch circuit 161 acquires the radio-frequency wave. The switch circuit 161 modulates the radio-frequency wave according to the input signal entered from the input terminal 101, generating a transmission signal. The transmission signal is entered into the second electromagnetic resonant coupler 182. The radio-frequency oscillator 170 also generates a radio-frequency wave used for monitoring. The radio-frequency wave for monitoring is entered into the first electromagnetic resonant coupler 180. That is, the radio-frequency oscillator 170 is a two-output radio-frequency oscillator, which outputs both a radio-frequency wave to be acquired by the switch circuit 161 and a radio-frequency wave for monitoring. For simplicity in the description below, the transmission signal generated by modulating the radio-frequency wave with the input signal will be sometimes referred to as the second transmission signal, and the radio-frequency wave for monitoring will be sometimes referred to as the first transmission signal. The first transmission signal does not always include a signal component; it may itself be a carrier.

The switch circuit 161 may be a so-called single-pole double-throw (SPDT) switch. The switch circuit 161 receives a radio-frequency wave from the radio-frequency oscillator 170 and switches a destination to which to output the radio-frequency wave according to an input signal. For example, when the input signal has a high-level voltage value, the switch circuit 161 switches the output destination so that the radio-frequency wave is output to the second electromagnetic resonant coupler 182; when the input signal has a low-level voltage value, the switch circuit 161 switches the output destination so that the radio-frequency wave is output to the third electromagnetic resonant coupler 181.

In other words, the switch circuit 161 generates the second transmission signal by outputting the radio-frequency wave to the second electromagnetic resonant coupler 182 in a period during which the input signal has a high-level voltage value. The switch circuit 161 also generates the third transmission signal by outputting the radio-frequency wave to the third electromagnetic resonant coupler 181 in a period during which the input signal has a low-level voltage value.

The radio-frequency oscillator 170 and the switch circuit 161 are disposed on the primary side of the gate drive circuit 100.

The second electromagnetic resonant coupler 182 isolatedly transmits the second transmission signal from the primary side to the secondary side, which is isolated from the primary side. The second electromagnetic resonant coupler 182 includes two open-ring resonators 182a and 182b. The second electromagnetic resonant coupler 182 is, for example, an open-ring electromagnetic resonant coupler as described in, for example, Japanese Unexamined Patent Application Publication No. 2008-067012. However, the second electromagnetic resonant coupler 182 may be any device that can isolatedly transmit a signal through electromagnetic resonance coupling. The second transmission signal is isolatedly transmitted by the second electromagnetic resonant coupler 182, passed through the input capacitor 220, and then entered into the second rectifier circuit 224.

The third electromagnetic resonant coupler 181 isolatedly transmits the third transmission signal entered from the primary side to the secondary side, which is isolated from the primary side.

The second rectifier circuit 224 acquires the second transmission signal, which has been isolatedly transmitted from the primary side to the secondary side by the second electromagnetic resonant coupler 182. The second rectifier circuit 224 demodulates the second transmission signal by rectifying it, and then outputs the demodulated signal to the second output terminal 203 as a first output signal. The second rectifier circuit 224 is disposed on the secondary side of the gate drive circuit 200. The second rectifier circuit 224, for example, includes a diode 221, an inductor 222, and a smoothing capacitor 223.

The cathode of the diode 221 and one end of the inductor 222 are connected to the input end of the second rectifier circuit 224. One end of the smoothing capacitor 223 and the second output terminal 203 are connected to the other end of the inductor 222. The anode of the diode 221 and the other end of the smoothing capacitor 223 are connected to the second output reference terminal 204.

Therefore, the second rectifier circuit 224 generates the first output signal by demodulating a portion, of the second transmission signal, that has a positive voltage value with respect to the voltage at the second output reference terminal 204. In the example in FIG. 10, the first output signal has a positive voltage or 0 V with respect to the voltage at the second output reference terminal 204. Therefore, the second rectifier circuit 224 may also be referred to as the positive-side rectifier circuit.

The second rectifier circuit 224 is not limited to this circuit structure. Any other circuit structures may be used if they can rectify a radio-frequency wave to modulate it.

The third rectifier circuit 134 is as described by using the example illustrated in FIG. 2. That is, the third rectifier circuit 134 acquires the third transmission signal, which has been isolatedly transmitted from the primary side to the secondary side by the third electromagnetic resonant coupler 181. The third rectifier circuit 134 demodulates the third transmission signal by rectifying it, and then outputs the demodulated signal to the second output terminal 203 as the second output signal.

The second output terminal 203 and the second output reference terminal 204 are disposed on the secondary side of the gate drive circuit 200. The second output terminal 203 and the second output reference terminal 204 are paired terminals to which an output signal including the first output signal and the second output signal is output. For example, the first output signal becomes the positive voltage component of the output signal based on the second output reference terminal 204, and the second output signal becomes the negative voltage component of the output signal based on the second output reference terminal 204. That is, an output signal for driving a semiconductor switching element is output to the second output terminal 203 according to the input signal.

In the gate drive circuit 200 in FIG. 10, the second output terminal 203 is connected to the gate terminal of a semiconductor switching element, and the second output reference terminal 204 is connected to the source terminal of the semiconductor switching element.

Next, a portion, in the gate drive circuit 200, which is used to monitor the reflected signal will be described.

In the example illustrated in FIG. 10, the first transmission signal generated by the radio-frequency oscillator 170 is amplified by the amplifier circuit 154, passed through the capacitor 153, and then entered into the first electromagnetic resonant coupler 180.

The first electromagnetic resonant coupler 180 isolatedly transmits the first transmission signal entered from the primary side to the secondary side, which is isolated from the primary side.

The first rectifier circuit 124 acquires the first transmission signal, which has been isolatedly transmitted from the primary side to the secondary side by the first electromagnetic resonant coupler 180. The first rectifier circuit 124 demodulates the first transmission signal by rectifying it, and then outputs the demodulated signal to the first output terminal 103.

The variable capacitance diode 110 is disposed so that its one end is connected to a transmission line that is connected to the second terminal 192, a secondary-side terminal, of the first electromagnetic resonant coupler 180. When the capacitance of the variable capacitance diode 110 varies, the input impedance on the transmission line varies, so an reflection amount of the first transmission signal varies. In the second embodiment, a radio-frequency wave needs to be isolatedly transmitted to the secondary side in order to generate a reflected signal, but a signal does not always need to be output to the first output terminal 103. Therefore, the first rectifier circuit 124 may not be provided.

When the first transmission signal is isolatedly transmitted to the secondary side, the first transmission signal is reflected on the secondary side, and the reflected signal is transmitted from the secondary side to the primary side with the first electromagnetic resonant coupler 180. The monitoring-specific rectifier circuit 144 rectifies the reflected signal.

The reflected signal is output from the first terminal 191 of the first electromagnetic resonant coupler 180, passed through the separating capacitor 150 and then entered into the amplifier circuit 151. The reflected signal is amplified by the amplifier circuit 151, output from the amplifier circuit 151, and then entered into the monitoring-specific rectifier circuit 144.

A reflection amount of the reflected signal varies according to the voltage value of the monitor signal entered into the monitor terminal 105. A reflection amount of the reflected signal may be, for example, the amplitude of the reflected signal.

As described above, the gate drive circuit 200 includes the separating capacitor 150 and the capacitor 153. The separating capacitor 150 adjusts an amount of the reflected signal input from the first electromagnetic resonant coupler 180 to the monitoring-specific rectifier circuit 144, and the capacitor 153 adjusts an amount of the reflected signal input from the first electromagnetic resonant coupler 180 toward the radio-frequency oscillator 170.

The reflected signal rectified by the monitoring-specific rectifier circuit 144 is output to the monitor output terminal 102.

With the gate drive circuit 200, a monitor voltage applied to the monitor terminal 105 on the secondary side can be monitored through the monitor output terminal 102 on the primary side, as in the first embodiment.

With the gate drive circuit 100 illustrated in FIG. 2, the first transmission signal is used not only as a signal from which a reflected signal for monitoring is generated but also to drive a semiconductor switching element connected to the first output terminal 103. Therefore, if the voltage output to the first output terminal 103 is 0 V or lower, the voltage at the monitor terminal 105 may not be monitored.

With the gate drive circuit 200, however, the second transmission signal for driving a semiconductor switching element and the first transmission signal for monitoring are transmitted by different electromagnetic resonant couplers. In addition, the output signal is output from the second output terminal 203, which differs from the first output terminal 103. That is, the first transmission signal is used only for monitoring. With the gate drive circuit 200, therefore, the voltage at the monitor terminal 105 can be constantly monitored.

Furthermore, with the gate drive circuit 200, the first output reference terminal 104 and the second output reference terminal 204 can be mutually isolated. That is, the reference voltage at the monitor terminal 105 can be made to be different from the reference voltage at the second output reference terminal 204.

With the gate drive circuit 200, as described above, the voltage at the monitor terminal 105 can be monitored regardless of the voltage applied to the load connected to the second output terminal 203.

As in the first embodiment, the variable capacitance diode 110 and the other reflection circuits may be omitted. The input capacitor 130, the third electromagnetic resonant coupler 181, and the third rectifier circuit 134 may also be omitted.

As in the first embodiment, the radio-frequency oscillator 170 may be omitted. The gate drive circuit 200 may acquire a radio-frequency wave from the outside.

The first electromagnetic resonant coupler 180, second electromagnetic resonant coupler 182, and the third electromagnetic resonant coupler 181 have been described as different electromagnetic resonant couplers. However, the gate drive circuit 200 may include a single two-input two-output electromagnetic resonant coupler that has functions for two electromagnetic resonant couplers. A single electromagnetic resonant coupler having functions for two electromagnetic resonant couplers can transmit two signals separately. The second electromagnetic resonant coupler 182 and the third electromagnetic resonant coupler 181, for example, may be implemented by a single electromagnetic resonant coupler.

The gate drive circuit 200 may also include a single electromagnetic resonant coupler that can transmit two types of signals at different frequencies separately.

Although, in the example in FIG. 10, the radio-frequency oscillator 170 outputs two radio-frequency waves, the gate drive circuit 200 may include two radio-frequency oscillators 170 each of which outputs one radio-frequency wave.

The radio-frequency oscillator 170 may separate one radio-frequency wave into a higher harmonic wave and another wave, and then may output those waves. Then, the radio-frequency oscillator 170 can output one of these two types of signals to the first electromagnetic resonant coupler 180 and the other to the third electromagnetic resonant coupler 181 and the second electromagnetic resonant coupler 182.

Other Embodiments

So far, the gate drive circuits according to the first and second embodiments have been described.

The gate drive circuits according to the first and second embodiments, which have a signal isolating function, enable a secondary-side signal to be monitored on the primary side.

The circuit structures illustrated in the circuit drawings are only examples. The present disclosure is not limited to these circuit structures. That is, as with these circuit structures, circuits that can implement characteristic functions in the present disclosure are also included in the present disclosure. For example, a circuit is also included in the present disclosure in which a switching element (i.e., transistor), a resistive element, a capacitive element, or the like is connected in parallel to or in series with a certain element, within a range in which a function similar to one of the functions of the above circuit structures can be implemented. In other words, "connected" in the present disclosure is not limited to a connection in which two terminals are directly connected, but includes a connection in which the two terminals are connected with an element intervening therebetween within a range in which a similar function can be implemented. Representations concerning input and output of a signal are not limited to a case in which the signal is directly entered and output, but include a case as well in which the signal is indirectly entered and output. For example, "a signal is output from A to B", "a signal is entered into B from A", "a signal is output from A and is entered into B", and other representations include a structure as well in which another element or circuit is present between A and B. These representations also include a case in which the signal output from A changes its form as a result of having passed through another element or circuit and the signal in the changed form is entered into B.

The present disclosure is not limited to the embodiments described above and their variations. The range of the present disclosure includes embodiments in which various variations that a person having ordinary skill in the art thinks of are applied to the embodiments described above and their variations and also includes embodiments in which constituent elements in different embodiments or their variations are combined, without departing from the intended scope of the present disclosure.

For example, the gate drive circuit is a gate drive circuit that drives a semiconductor switching element. The gate drive circuit may include: a first electromagnetic resonant coupler that transmits a first transmission signal entered from the primary side of the gate drive circuit to its secondary side, which is isolated from the primary side, without contact; a monitoring-specific rectifier circuit, disposed on the primary side, that demodulates a reflected signal, which is generated by transmitting the first transmission signal to the secondary side without contact and then outputting the first transmission signal to the primary side through the first electromagnetic resonant coupler; and a monitor output terminal to which the reflected signal demodulated by the monitoring-specific rectifier circuit is output.

For example, the gate drive circuit may further include: an input terminal, disposed on the primary side, to which an input signal is entered; a modulator circuit, disposed on the primary side, that generates, as the first transmission signal, a signal by acquiring a radio-frequency wave and modulating the acquired radio-frequency wave according to the input signal entered into the input terminal; a first rectifier circuit, disposed on the secondary side, that demodulates the first transmission signal transmitted by the first electromagnetic resonant coupler without contact; and a first output terminal, disposed on the secondary side, to which the signal demodulated by the first electromagnetic resonant coupler is output as an output signal that drives a semiconductor switching element.

For example, the first electromagnetic resonant coupler may include a first terminal, disposed on the primary side, into which the first transmission signal is entered, a second terminal, disposed on the secondary side, from which the first transmission signal entered into the first terminal and transmitted without contact is output, and a third terminal, disposed on the primary side, to which a reflected signal is output, and the monitoring-specific rectifier circuit may demodulate the reflected signal output to the third terminal.

For example, the gate drive circuit may further include: an input terminal, disposed on the primary side, to which an input signal is entered; a modulator circuit, disposed on the primary side, that generates, as a second transmission signal, a signal by acquiring a radio-frequency wave and modulating the acquired radio-frequency wave according to the input signal entered into the input terminal; a second electromagnetic resonant coupler that transmits the second transmission signal without contact; a second rectifier circuit, disposed on the secondary side, that demodulates the second transmission signal transmitted by the second electromagnetic resonant coupler without contact; a second output terminal, disposed on the secondary side, to which the signal demodulated by the second electromagnetic resonant coupler is output as an output signal that drives a semiconductor switching element; a first rectifier circuit, disposed on the secondary side, that demodulates the first transmission signal transmitted by the first electromagnetic resonant coupler without contact; and a first output terminal, disposed on the secondary side, to which the signal demodulated by the first electromagnetic resonant coupler is output.

For example, the gate drive circuit may include: a first rectifier circuit, disposed on the secondary side, that demodulates the first transmission signal transmitted by the first electromagnetic resonant coupler without contact; and a first output terminal, disposed on the secondary side, to which the signal demodulated by the first electromagnetic resonant coupler is output.

For example, the gate drive circuit may further include a monitor terminal disposed on the secondary side and a reflection circuit that adjusts an amount by which a reflected signal is reflected according to a signal entered into the monitor terminal.

For example, the reflection circuit may be a variable capacitance diode disposed between the terminal, close to the secondary side, of the first electromagnetic resonant coupler and the ground on the secondary side, the capacitance of the diode varying according to a signal entered into the monitor terminal.

For example, the reflection circuit may be a transistor disposed between the terminal, close to the secondary side, of the first electromagnetic resonant coupler and the ground on the secondary side, the transistor being selectively turned on and off according to a signal entered into the monitor terminal.

For example, the gate drive circuit may further include a radio-frequency oscillator that generates the radio-frequency wave to be acquired by the modulator circuit.

For example, the radio-frequency oscillator may vary the oscillation frequency of the radio-frequency wave that the radio-frequency oscillator generates according to the demodulated reflected signal output to the monitor output terminal.

For example, the modulator circuit may vary the amplitude of the radio-frequency wave that the radio-frequency oscillator generates according to the demodulated reflected signal output to the monitor output terminal.

For example, the gate drive circuit may further include, between the modulator circuit and first electromagnetic resonant coupler, a directional coupler that receives the first transmission signal from the modulator circuit and outputs it to the first electromagnetic resonant coupler and also receives the reflected signal from the first electromagnetic resonant coupler and outputs it to the monitoring-specific rectifier circuit.

For example, the modulator circuit may be any one of a mixer circuit that generates the first transmission signal by mixing the acquired radio-frequency wave with the input signal entered into the input terminal to modulate the radio-frequency wave and a switch circuit that generates the first transmission signal by enabling and disabling the output of the acquired radio-frequency wave to the first electromagnetic resonant coupler according to the input signal entered into the input terminal.

For example, the gate drive circuit may further include a radio-frequency oscillator that generates the first transmission signal and the radio-frequency wave to be acquired by the modulator circuit.

The gate drive circuit according to the present disclosure is useful as a gate drive circuit that drives a semiconductor switching element.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A gate drive circuit comprising:
   a first electromagnetic resonant coupler that isolatedly transmits a transmission signal from a primary side of the gate drive circuit to a secondary side of the gate drive circuit, and isolatedly transmits a reflected signal from the secondary side to the primary side, the primary side and the secondary side isolated from each other, the reflected signal generated by reflecting the transmission signal on the secondary side;
   a modulator circuit that modulates a radio-frequency wave with an input signal to generate the transmission signal and outputs the transmission signal to the first electromagnetic resonant coupler, the modulator circuit disposed on the primary side;
   a demodulator circuit that demodulates the transmission signal input from the first electromagnetic resonant coupler to generate an output signal and outputs the output signal to a semiconductor switch, the demodulator circuit disposed on the secondary side;

a variable capacitance diode into which the transmission signal is input from the first electromagnetic resonant coupler, the variable capacitance diode disposed on the secondary side, the variable capacitance diode allowing a capacitance thereof to vary according to a monitor signal; and a reflected signal rectifier circuit that rectifies the reflected signal input from the first electromagnetic resonant coupler to generate a monitor output signal, the reflected signal rectifier circuit disposed on the primary side.

2. The gate drive circuit according to claim 1, wherein the demodulation circuit includes a rectifier circuit that rectifies the transmission signal to generate the output signal.

3. The gate drive circuit according to claim 2, wherein:
the variable capacitance diode is disposed between the first electromagnetic resonant coupler and the rectifier circuit; and
the reflected signal is generated by reflecting the transmission signal between the first electromagnetic resonant coupler and the rectifier circuit.

4. The gate drive circuit according to claim 2, further comprising:
a transmission line extending between the first electromagnetic resonant coupler and the rectifier circuit;
an output terminal through which the output signal is output to a semiconductor switch, the output terminal disposed on the secondary side;
an output reference terminal through which an output reference potential is applied to the semiconductor switch, the output reference terminal disposed on the secondary side, wherein
one end of the variable capacitance diode is connected to the transmission line, and
the other end of the variable capacitance diode is connected to the output reference terminal.

5. The gate drive circuit according to claim 1, further comprising a signal separator that separates the transmission signal and reflected signal from each other, the signal separator disposed between the modulator circuit and the first electromagnetic resonant coupler on the primary side.

6. The gate drive circuit according to claim 1, further comprising a directional coupler that allows the transmission signal to pass from the modulator circuit to the first electromagnetic resonant coupler and also allows the reflected signal to pass from the first electromagnetic resonant coupler to the reflected signal rectifier circuit, the directional coupler disposed between the modulator circuit and the first electromagnetic resonant coupler on the primary side.

7. The gate drive circuit according to claim 1, wherein the first electromagnetic resonant coupler includes:
a first terminal into which the transmission signal is input, the first terminal disposed on the primary side;
a second terminal from which the transmission signal input from the first terminal is output and into which the reflected signal is input, the second terminal disposed on the secondary side; and
a third terminal from which the reflected signal input from the second terminal is output, the third terminal disposed on the primary side, and
the reflected signal rectifier circuit rectifies the reflected signal output from the third terminal.

8. The gate drive circuit according to claim 1, wherein the variable capacitance diode allows an amplitude of the reflected signal to vary according to the capacitance thereof.

9. The gate drive circuit according to claim 1, further comprising a radio-frequency oscillator that generates the radio-frequency wave and outputs the radio-frequency wave to the modulator circuit, the radio-frequency oscillator disposed on the primary side.

10. The gate drive circuit according to claim 1, wherein the modulator circuit includes any one of a mixer circuit that mixes the radio-frequency wave and the input signal and a switch circuit that selectively outputs the radio-frequency wave according to the input signal.

11. The gate drive circuit according to claim 1, further comprising:
an input terminal through which the input signal is input to the modulator circuit, the input terminal disposed on the primary side;
an output terminal through which the output signal is output to a semiconductor switch, the output terminal disposed on the secondary side; and
a monitor terminal through which the monitor signal is input to the reflected signal rectifier circuit, the monitor terminal disposed on the secondary side.

12. A gate drive circuit comprising:
a first electromagnetic resonant coupler that isolatedly transmits a first radio-frequency wave from a primary side of the gate drive circuit to a secondary side of the gate drive circuit, and isolatedly transmits a reflected signal from the secondary side to the primary side, the primary side and the secondary side isolated from each other, the reflected signal generated by reflecting the first radio-frequency wave on the secondary side;
a modulator circuit that modulates a second radio-frequency wave with an input signal to generate the transmission signal and outputs the transmission signal to the second electromagnetic resonant coupler, the modulator circuit disposed on the primary side;
a second electromagnetic resonant coupler that isolatedly transmits a transmission signal from the primary side to the secondary side;
a demodulator circuit that demodulates the transmission signal input from the second electromagnetic resonant coupler to generate an output signal, the demodulator circuit disposed on the secondary side;
a variable capacitance diode into which the first radio-frequency wave is input from the first electromagnetic resonant coupler, the variable capacitance diode disposed on the secondary side, the variable capacitance diode allowing a capacitance thereof to vary according to a monitor signal; and
a reflected signal rectifier circuit that rectifies the reflected signal input from the first electromagnetic resonant coupler to generate a monitor output signal, the reflected signal rectifier circuit disposed on the primary side.

13. The gate drive circuit according to claim 12, wherein the demodulation circuit includes a rectifier circuit that rectifies the transmission signal to generate the output signal.

14. The gate drive circuit according to claim 12, further comprising a transmission line extending from the first electromagnetic resonant coupler to the secondary side, wherein:
one end of the variable capacitance diode is connected to the transmission line; and
the reflected signal is generated by reflecting the first radio-frequency wave on the transmission line.

15. The gate drive circuit according to claim 12, further comprising:
a transmission line extending from the first electromagnetic resonant coupler to the secondary side; and a reference potential line that applies a reference potential, the reference potential line disposed on the secondary side, wherein one end of the variable capacitance diode is connected to the transmission line, and the other end of the variable capacitance diode is connected to the reference potential line.

16. The gate drive circuit according to claim 12, wherein the variable capacitance diode causes an amplitude of the reflected signal to vary, when the capacitance of the variable capacitance diode varies.

17. The gate drive circuit according to claim 12, further comprising a radio-frequency oscillator that generates the first and second radio-frequency waves, the radio-frequency oscillator disposed on the primary side.

18. The gate drive circuit according to claim 17, wherein the radio-frequency oscillator allows an oscillation frequency thereof to vary according to the monitor output signal.

19. The gate drive circuit according to claim 12, wherein the modulator circuit allows an amplitude of the second radio-frequency wave to vary according to the monitor output signal.

20. The gate drive circuit according to claim 12, wherein the modulator circuit includes any one of a mixer circuit that mixes the second radio-frequency wave and the input signal and a switch circuit that selectively outputs the second radio-frequency wave according to the input signal.

* * * * *